(12) United States Patent
Mark et al.

(10) Patent No.: US 12,009,227 B2
(45) Date of Patent: Jun. 11, 2024

(54) ELECTROSTATIC SUBSTRATE CLEANING SYSTEM AND METHOD

(71) Applicant: KLA Corporation, Milpitas, CA (US)

(72) Inventors: Shai Mark, Kibutz Snir (IL); Adi Pahima, Migdal Ha'emek (IL)

(73) Assignee: KLA Corporation, Milpitas, CA (US)

( * ) Notice: Subject to any disclaimer, the term of this patent is extended or adjusted under 35 U.S.C. 154(b) by 17 days.

(21) Appl. No.: 17/735,867

(22) Filed: May 3, 2022

(65) Prior Publication Data
US 2022/0359234 A1    Nov. 10, 2022

Related U.S. Application Data

(60) Provisional application No. 63/185,365, filed on May 7, 2021.

(51) Int. Cl.
  *H01L 21/67*    (2006.01)
  *B08B 6/00*    (2006.01)
  *B08B 13/00*    (2006.01)
  *H01L 21/02*    (2006.01)

(52) U.S. Cl.
  CPC .......... *H01L 21/67034* (2013.01); *B08B 6/00* (2013.01); *B08B 13/00* (2013.01); *H01L 21/02046* (2013.01)

(58) Field of Classification Search
  CPC ..... B08B 13/00; B08B 6/00; H01L 21/02046; H01L 21/67028; H01L 21/67034
  See application file for complete search history.

(56) References Cited

U.S. PATENT DOCUMENTS

| 5,000,203 A | * | 3/1991 | Hamada | B03C 7/00 134/1 |
| 2009/0250077 A1 | * | 10/2009 | Harano | H01L 21/02096 134/1 |
| 2018/0257116 A1 | | 9/2018 | Thirunavukarasu et al. | |

FOREIGN PATENT DOCUMENTS

| JP | 0553481 A | * | 3/1993 |
| JP | 2003282671 A | * | 10/2003 |
| JP | 2003282671 A | | 10/2003 |
| KR | 20130053528 A | | 5/2013 |
| WO | 2015195292 A1 | | 12/2015 |

OTHER PUBLICATIONS

Machine translation of JP05-53481A (Year: 1993).*
Machine translation of JP2003-282671A (Year: 2003).*
International Search Report and Written Opinion in European Application No. PCT/US2022/027954 dated Aug. 25, 2022, 9 pages.

* cited by examiner

*Primary Examiner* — Douglas Lee
(74) *Attorney, Agent, or Firm* — Suiter Swantz IP

(57) ABSTRACT

A substrate cleaning system include a chamber and a substrate stage positioned within the chamber. The substrate stage is configured to secure a substrate for cleaning with a cleaning head. The substrate cleaning system includes a robot configured to transfer the substrate between a storage receptable and the substrate stage. The cleaning head includes a disposable electrode ribbon loaded on a roller assembly. The disposable electrode ribbon includes a positive electrode and a negative electrode and is configured to electrostatically clean the substrate by electrostatically removing particles from the substrate. The roller assembly is configured to advance the disposable electrode ribbon following cleaning of the substrate.

20 Claims, 5 Drawing Sheets

ELECTROSTATIC SUBSTRATE CLEANING SYSTEM AND METHOD

CROSS-REFERENCE TO RELATED APPLICATIONS

The present application claims the benefit under 35 U.S.C. § 119(e) of U.S. Provisional Patent Application Ser. No. 63/185,365, filed May 7, 2021, which is incorporated herein by reference in the entirety.

TECHNICAL FIELD

The present invention generally relates to wafer cleaning, and, more particularly, to an apparatus and method for electrostatically cleaning silicon wafers.

BACKGROUND

Silicon wafers are typically cleaned by either chemical solvents or vibration techniques (e.g., ultra-sonic or mega-sonic cleaning). Chemical solvents can be dangerous to use and damaging to the wafer, and vibration techniques often require large expensive tools. Additionally, both methods often result in low throughput. As such, it would be advantageous to provide a system and method to remedy the shortcomings of the approaches identified above.

SUMMARY

A substrate cleaning system is disclosed, in accordance with one or more illustrative embodiments of the present disclosure. In one illustrative embodiment, the substrate cleaning system includes a chamber. In another illustrative embodiment, the substrate cleaning system includes a substrate stage positioned within the chamber and configured to secure a substrate for cleaning. In another illustrative embodiment, the substrate cleaning system includes a robot, where the robot is configured to transfer the substrate between a storage receptable and the substrate stage within the chamber. In another illustrative embodiment, the substrate cleaning system includes a cleaning head, where the cleaning head includes a disposable electrode ribbon loaded on a roller assembly. In another illustrative embodiment, the disposable electrode ribbon includes a positive electrode and a negative electrode, where the disposable electrode is configured to electrostatically clean the substrate by electrostatically removing particles from the substrate. In another illustrative embodiment, the roller assembly is configured to advance the disposable electrode ribbon following cleaning of the substrate.

An apparatus is disclosed, in accordance with one or more illustrative embodiments of the present disclosure. In one illustrative embodiment, the substrate cleaning apparatus includes a roller assembly. In another illustrative embodiment, the substrate cleaning apparatus includes a disposable electrode ribbon loaded on the roller assembly. In another illustrative embodiment, the disposable electrode ribbon includes a positive electrode and a negative electrode. In another illustrative embodiment, the disposable electrode ribbon is configured to electrostatically clean a substrate by electrostatically removing particles from the substrate. In another illustrative embodiment, the roller assembly is configured to advance the disposable electrode ribbon following cleaning of the substrate.

A method of cleaning a substrate is disclosed, in accordance with one or more illustrative embodiments of the present disclosure. In one illustrative embodiment, the method may include, but is not limited to, transferring a substrate from a substrate storage receptable to a substrate stage within a vacuum chamber. In another illustrative embodiment, the method may include, but is not limited to, actuating, with the substrate stage, the substrate to a position under a cleaning head. In another illustrative embodiment, the method may include, but is not limited to, actuating, with a cleaning lift assembly, the substrate to a selected cleaning distance above the substrate. In another illustrative embodiment, the method may include, but is not limited to, activating a disposable electrode ribbon to electrostatically clean a surface of the substrate by removing particles from the substrate, where the disposable electrode ribbon is activated by applying a bias voltage between a positive electrode and a negative electrode. In another illustrative embodiment, the method may include, but is not limited to, advancing the roller to expose an unused portion of the disposable electrode ribbon.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Embodiments of the present disclosure are directed to a substrate cleaning system and process. For example, embodiments of the present disclosure are directed to a substrate clean system and process for cleaning processed and/or blank silicon wafers within a semiconductor fabrication system, a wafer inspection system, or wafer metrology system. In this sense, the substrate cleaning system and process of the present disclosure may be integrated with a semiconductor fabrication system, a wafer inspection system, or a wafer metrology system. For example, the cleaning system of the present disclosure may be implemented in a wafer fabrication facility to clean inline production wafers or may be implemented in wafer manufacturing houses to clean blank wafers. The substrate cleaning system and process of the present disclosure may clean substrates utilizing a disposable electrode ribbon to initiate a dielectrophoresis-based cleaning process, which causes particles on a given substrate to move away from the substrate in a direction of an electric field gradient formed by the disposable electrode ribbon.

Figure 1A:
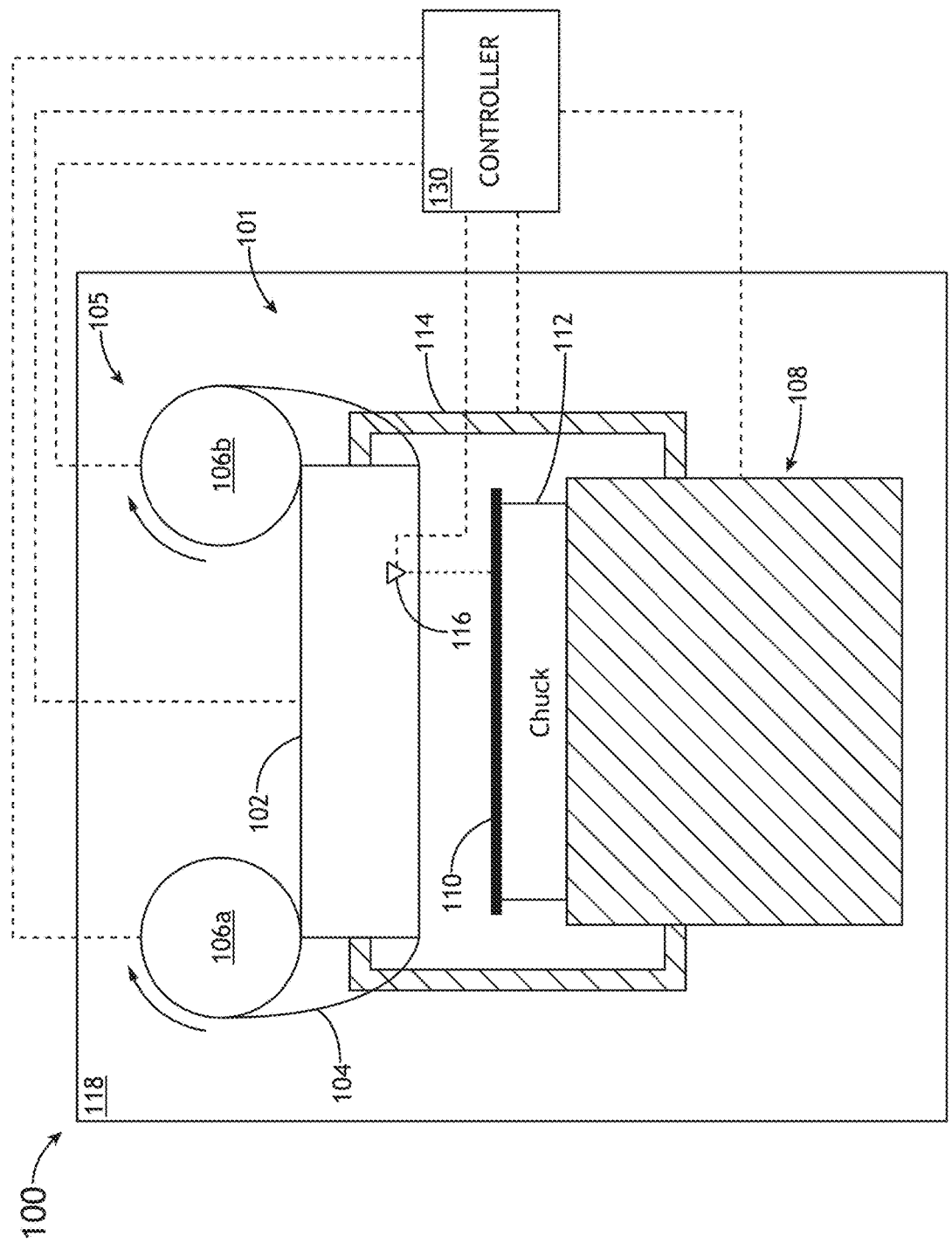
FIG. 1A illustrates a simplified schematic end view of the substrate cleaning system, in accordance with one or more embodiments of the present disclosure.
Figure 1B:
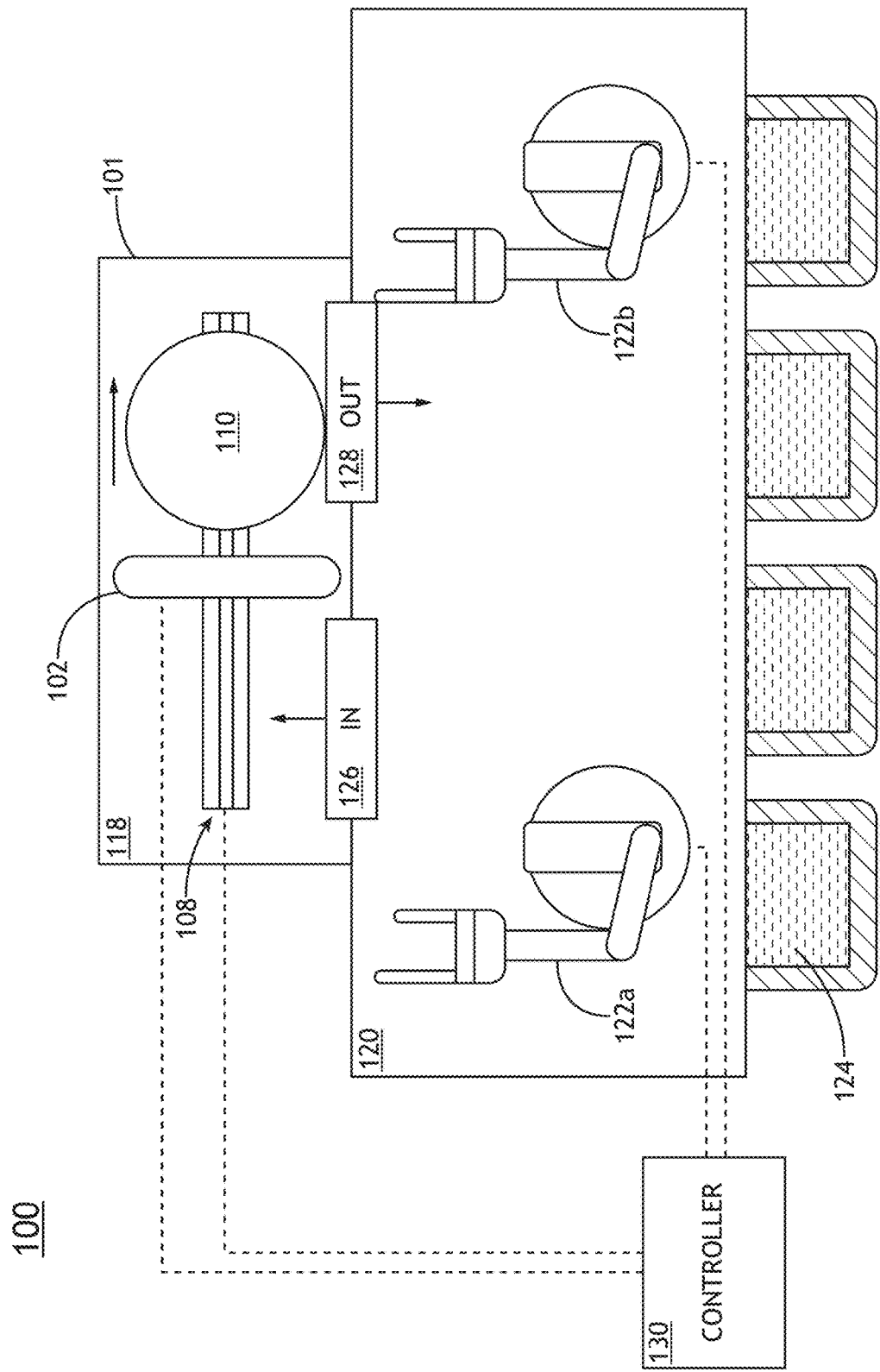
FIG. 1B illustrates a simplified top view of the substrate cleaning system integrated with a substrate handling system.

FIGS. 1A-1B illustrate simplified schematic views of the substrate cleaning system 100, in accordance with one or more embodiments of the present disclosure. FIG. 1A illustrates a simplified schematic end view of the substrate cleaning system 100. FIG. 1B illustrates a simplified top view of the substrate cleaning system 100 as it is integrated with a substrate handling system 120.

In embodiments, the cleaning system 100 includes cleaning station 101. The cleaning station 101 includes a cleaning head 102. The cleaning head may include a disposable electrode ribbon 104 loaded on a roller assembly 105. The roller assembly 105 may include one or more rollers 106a, 106b. In embodiments, the disposable electrode ribbon 104 includes a positive electrode and a negative electrode. The disposable electrode ribbon may be configured to electrostatically clean the substrate 110 by electrostatically removing particles from the substrate 110. In this regard, particles disposed on the substrate 110 may detach from the substrate 110 and are collected by the disposable electrode ribbon 104. During operation, the roller assembly 105 may advance the disposable electrode ribbon 104 following cleaning of the substrate 110 such that a fresh portion of the disposable electrode ribbon 104 is available for the next cleaning cycle (e.g., repeated cleaning of the current substrate or cleaning of a subsequent substrate). In embodiments, one or more rollers 106a, 106b include an electric motor, which may be controlled to rotate the one or more rollers, thereby advancing the disposable electrode ribbon 104.

In embodiments, the cleaning system 100 includes a substrate stage 108 for securing and actuating the substrate 110. The substrate stage 108 may include a chuck 112. For example, the chuck 112 may include a wafer chuck such as, but not limited to, a vacuum wafer chuck. In embodiments, the substrate stage 108 is configured to actuate the substrate 110 to a position under the cleaning head 102. For example, the substrate stage 108 may include a linear stage and/or a rotational stage. It is noted that, while a linear stage is depicted in FIG. 1B, this should not be interpreted as a limitation on the scope of the present disclosure. It is contemplated that a rotational stage may be implemented whereby the stage rotates a substrate 110 under the cleaning head 102.

In embodiments, the cleaning system 100 includes a cleaning head lift actuator 114 and a proximity sensor 116. In embodiments, the cleaning head lift actuator 114 is configured to lower the cleaning head 102 to a selected cleaning distance above the substrate 110. The cleaning head lift actuator 114 may include, but is not limited to, a mechanical actuator (e.g., stepper). In embodiments, proximity sensor 116 is configured to identify when the selected cleaning distance between the cleaning head 102 and a top surface of the substrate 110 is attained. The proximity sensor 116 may include any proximity sensor know in the art. For example, the proximity sensor 116 may include, but is not limited to, an optical sensor, an inductive sensor, a capacitive sensor, or an ultrasonic sensor.

In embodiments, the cleaning system 100 includes a vacuum chamber 118. One or more of the various components of the cleaning system 100 may be housed within the vacuum chamber 118. For example, the cleaning head 102, the roller assembly 105, the substrate stage 108, and/or the cleaning head lift actuator 114 may be contained within the vacuum chamber 118.

In embodiments, as shown in FIG. 1B, the cleaning system 100 includes a substrate handling system 120. In this sense, the cleaning station 101 of the cleaning system 100 may be integrated with the substrate handling system 120. The substrate cleaning station 101 and substrate handling system 120 may together be integrated within a semiconductor fabrication line, an inspection system, or a metrology system.

In embodiments, the handling sub-system 101 includes one or more robots 122a, 122b. The one or more robots 122a, 122b are configured to transfer substrates from storage receptacles 124 to the substrate stage 108. For example, one or more robots 122a, 122b may transfer a substrate to be cleaned 110 from the one of the storage receptacles 124 into the substrate handling system 120. In turn, the one or more robots 122a, 122b may load the substrate 110 into an input port 126 of the cleaning station 101. The input port 126 is then closed and the pressure is increased within the vacuum chamber 118 of the cleaning station 101. In turn, the substrate stage 108 may secure the substrate 110 via the chuck 112. After the substrate 110 is secured, the cleaning head lift actuator 114 may adjust the position of the cleaning head 102 to a selected cleaning distance (e.g., 50 μm) from the top surface of the substrate 110 using feedback from the proximity sensor 116. The substrate stage 108 may then translate the substrate 110 (e.g., translate to the right in FIG. 1B) so the entire wafer is scanned under the cleaning head 102. Following cleaning of the substrate 110, the substrate stage 108 may translate the substrate 110 to the output port 128. In turn, the one or more robots 122a, 122b of the substrate handling system 120 may move the substrate 110 to one of the storage receptables 124, where the substrate 110 may then be moved to a subsequent process/characterization tool. The storage receptacles 124 may include, but are not limited to, Front Opening Unified Pods (FOUPs).

Figure 2:
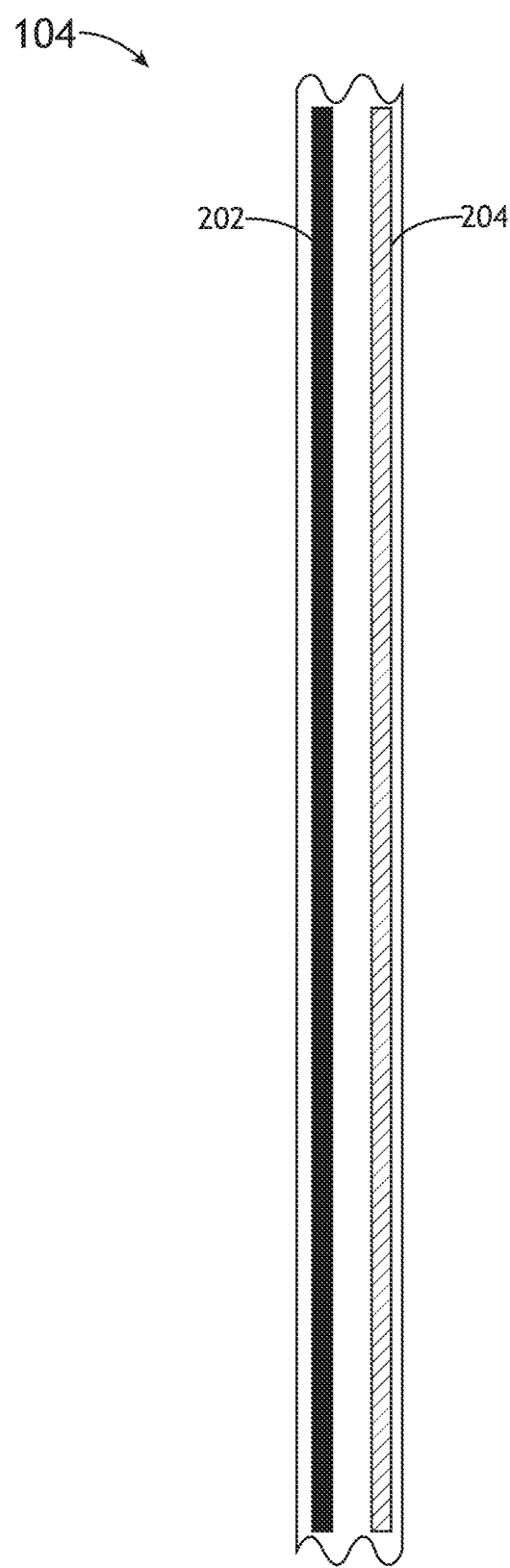
FIG. 2 illustrates a schematic view of the disposable cleaning ribbon, in accordance with one or more embodiments of the present disclosure.

FIG. 2 illustrates a schematic view of the disposable cleaning ribbon 104, in accordance with one or more embodiments of the present disclosure. In embodiments, as previously discussed herein, the disposable electrode ribbon 104 includes one or more negative electrodes 202 and one or more positive electrodes 204. The use of the negative electrode 202 and positive electrode 204 pair allows the ribbon 104 to electrostatically clean the substrate 110 via dielectrophoresis. During electrification of the ribbon, particles present on the substrate 110 may move away from the substrate 110 in a direction of an electric field gradient formed by the electrodes 202, 204 of the ribbon 104. For example, during electrification, the electric field gradient created by the electrodes 202, 204 may cause particles disposed on the substrate 110 to detach from the substrate 110 and move toward the ribbon 110, where they are then collected by ribbon 104. It is noted that all particles have ion mobility, even non-conductive particles. The ion mobility of particles increase as the particle temperature increases. In the case of semiconductor manufacture, the temperatures are often very high, so most particle materials of relevance have high ion-mobility during operation.

In embodiments, the backing of the ribbon 104 is formed from a flexible insulating material (e.g., plastic or rubber) allowing the ribbon to be rolled or coiled into rolls. During operation, following a given cleaning cycle, the roller assembly 105 may turn a roll (or a corresponding used roll) of the ribbon 110 using a roller so as to advance the disposable electrode ribbon 104 such that a fresh portion of the disposable electrode ribbon 104 is available for the next cleaning cycle.

In embodiments, the cleaning system 100 includes a controller 130. The controller 130 may include one or more processors and memory, wherein one or more program instructions are maintained in the memory. In embodiments, the controller 130 is configured to control one or more functions of system 100. In embodiments, the one or more program instructions are configured to cause the one or more processors to direct the one or more robots 122a, 122b to transfer the substrate 110 between a storage receptable 124 and the substrate stage 108 within the chamber 118.

In embodiments, the one or more program instructions are configured to cause the one or more processors to direct the cleaning head lift actuator 114 to lower the cleaning head 102 to a selected cleaning distance above the substrate 110. In embodiments, the controller 130 is configured to receive proximity data from the proximity sensor 116. For example, at the direction of the controller 130, the cleaning head lift actuator 114 may adjust the position of the cleaning head 102 to a selected cleaning distance from the top surface of the substrate 110 based on proximity data received by the controller 130 from the proximity sensor 116. In embodiments, the one or more program instructions are configured to cause the one or more processors to direct the stage to actuate the substrate along a path beneath the cleaning head 102. In embodiments, the one or more program instructions are configured to cause the one or more processors to apply a bias voltage between the negative electrode 202 and the positive electrode 204 of the disposable electrode ribbon 104. For example, the negative electrode 202 and the positive electrode 204 may be placed in connection with the controller 130 such that the controller 130 may control the bias voltage between the negative electrode 202 and the positive electrode 204. In embodiments, the one or more program instructions are configured to cause the one or more processors to advance one or more of rollers 106a, 106b to expose an unused portion of the disposable electrode ribbon 104. For example, one or more rollers 106a, 106b may include an electric motor, which is placed in connection with the controller 130 such that the controller 130 may control the rotation of the one or more rollers 106a, 106b, thereby selectively advancing the disposable electrode ribbon 104.

The one or more processors of the controller 130 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors may include any device configured to execute algorithms and/or instructions (e.g., program instructions stored in memory). In embodiments, the one or more processors may be embodied as a desktop computer, mainframe computer system, workstation, image computer, parallel processor, networked computer, or any other computer system configured to execute a program configured to operate or operate in conjunction with the system 100, as described throughout the present disclosure. Further, the steps described throughout the present disclosure may be carried out by a single controller or, alternatively, multiple controllers. Additionally, the controller 130 may include one or more controllers housed in a common housing or within multiple housings. In this way, any controller or combination of controllers may be separately packaged as a module suitable for integration into system 100. Further, the controller 130 may analyze data received from the detector 103 and feed the data to additional components within the system 100 or external to the system 100.

The memory of controller 130 may include any storage medium known in the art suitable for storing program instructions executable by the associated one or more processors. For example, the memory medium may include a non-transitory memory medium. By way of another example, the memory medium may include, but is not limited to, a read-only memory (ROM), a random-access memory (RAM), a magnetic or optical memory device (e.g., disk), a magnetic tape, a solid-state drive and the like. It is further noted that memory medium may be housed in a common controller housing with the one or more processors. In one embodiment, the memory medium may be located remotely with respect to the physical location of the one or more processors. For instance, the one or more processors may access a remote memory (e.g., server), accessible through a network (e.g., internet, intranet and the like).

Figure 3:
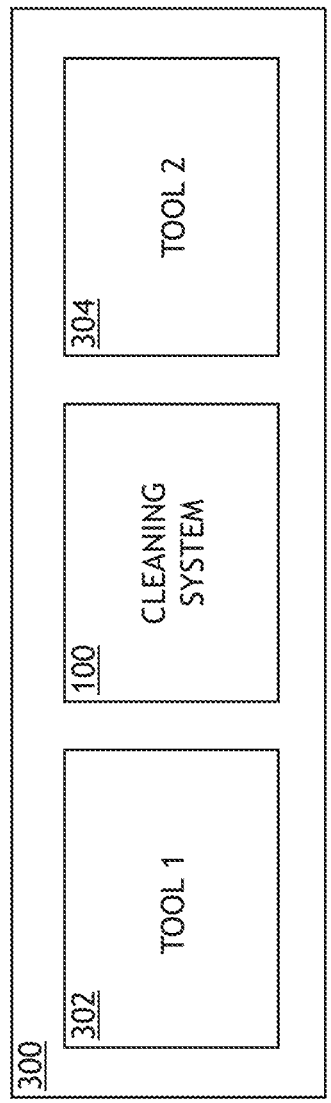
FIG. 3 illustrates a conceptual block diagram view of a system incorporating the substrate cleaning system, in accordance with one or more embodiments of the present disclosure.

FIG. 3 illustrates a conceptual block diagram view of a system 300 incorporating the substrate cleaning system 100, in accordance with one or more embodiments of the present disclosure. In embodiments, the system 300 may include a semiconductor fabrication tool and/or a characterization tool (e.g., inspection tool or metrology tool) such that the cleaning system 100 may be integrated within a semiconductor fabrication facility and/or a characterization system. For example, tool 1 302 may include, but is not limited to, a lithography tool, an inspection tool, and/or a metrology tool. By way of another example, tool 2 304 may include, but is not limited to, a lithography tool, an inspection tool, and/or a metrology tool.

Figure 4:
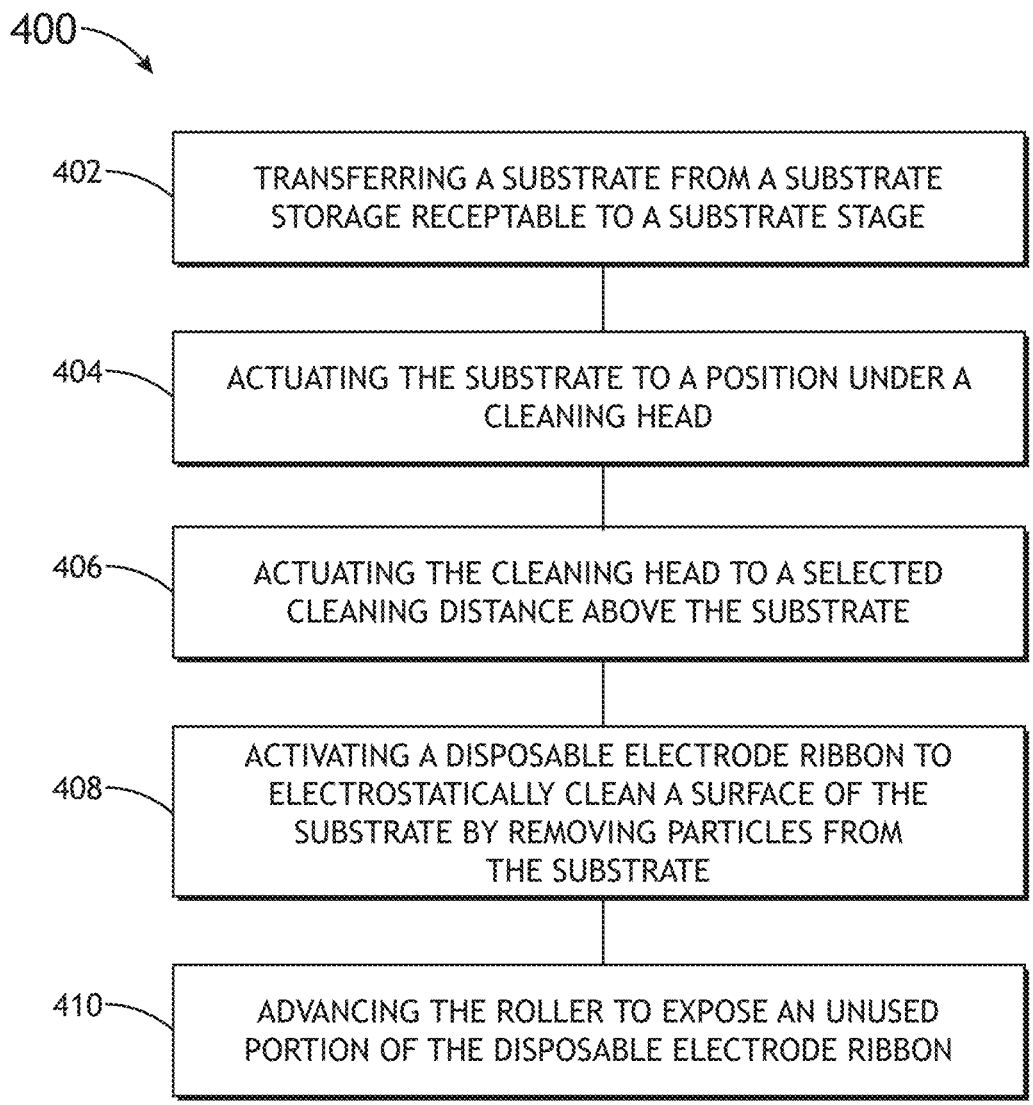
FIG. 4 illustrates a flow diagram illustrating a method of cleaning a substrate, in accordance with one or more embodiments of the present disclosure.

FIG. 4 illustrates a flow diagram illustrating a method of cleaning a substrate, in accordance with one or more embodiments of the present disclosure. In step 402, a substrate is transferred from a substrate storage receptable to a substrate stage. In step 404, with the substrate stage, the substrate is actuated to a position under a cleaning head. In step 406, with a cleaning lift assembly, the substrate is actuated to a selected cleaning distance above the substrate. In step 408, a disposable electrode ribbon is activated to electrostatically clean a surface of the substrate by removing particles from the substrate. The disposable electrode ribbon is activated by applying a bias voltage between a positive electrode and a negative electrode. In step 410, a roller holding the disposable electrode ribbon is advanced to expose an unused portion of the disposable electrode ribbon.

It is further contemplated that each of the embodiments of the method described above may include any other step(s) of any other method(s) described herein. In addition, each of the embodiments of the method described above may be performed by any of the systems described herein.

One skilled in the art will recognize that the herein described components operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A substrate cleaning system comprising:
    a chamber;
    a substrate stage positioned within the chamber and configured to secure a substrate for cleaning; and
    a cleaning head, wherein the cleaning head includes a disposable electrode ribbon loaded on a roller assembly, wherein the disposable electrode ribbon includes a positive electrode and a negative electrode, wherein the disposable electrode ribbon is configured to electrostatically clean the substrate by electrostatically removing particles from the substrate, wherein the roller assembly is configured to advance the disposable electrode ribbon following cleaning of the substrate.

2. The substrate cleaning system of claim 1, further comprising:
    a substrate handling sub-system, wherein the substrate handling sub-system includes a robot, wherein the robot is configured to transfer the substrate between a storage receptable and the substrate stage within the chamber.

3. The substrate cleaning system of claim 1, wherein the electrostatically cleaning the substrate is performed via dielectrophoresis, wherein the particles move away from the substrate in a direction of an electric field gradient formed by the disposable electrode ribbon.

4. The substrate cleaning system of claim 1, wherein particles disposed on the substrate detach from the substrate and are collected by the disposable electrode ribbon.

5. The substrate cleaning system of claim 1, wherein the storage receptable comprises a Front Opening Unified Pod (FOUP).

6. The substrate cleaning system of claim 1, wherein the substrate stage is configured to actuate the substrate to a position under the cleaning head.

7. The substrate cleaning system of claim 1, further comprising a cleaning head lift actuator and a proximity sensor.

8. The substrate cleaning system of claim 7, wherein the cleaning head lift actuator is configured to lower the cleaning head to a selected cleaning distance above the substrate, wherein the proximity sensor is configured to identify when the selected cleaning distance between the cleaning head and a top surface of the substrate is attained.

9. The substrate cleaning system of claim 1, further comprising a controller, wherein the controller includes one or more processors and memory, wherein one or more program instructions are maintained in the memory, wherein the one or more program instructions are configured to cause the one or more processors to:
 direct the robot to transfer the substrate between a storage receptable and the substrate stage within the chamber.

10. The substrate cleaning system of claim 1, wherein the one or more program instructions are configured to cause the one or more processors to:
 direct the cleaning head lift actuator to lower the cleaning head to a selected cleaning distance above the substrate.

11. The substrate cleaning system of claim 1, wherein the one or more program instructions are configured to cause the one or more processors to:
 direct the stage to actuate the substrate along a path beneath the cleaning head.

12. The substrate cleaning system of claim 1, wherein the one or more program instructions are configured to cause the one or more processors to:
 apply a bias voltage between the positive electrode and the negative electrode of the disposable electrode ribbon.

13. The substrate cleaning system of claim 1, wherein the one or more program instructions are configured to cause the one or more processors to:
 advance the roller to expose an unused portion of the disposable electrode ribbon.

14. The substrate cleaning system of claim 1, wherein the substrate comprises a semiconductor wafer.

15. The apparatus of claim 1, wherein the roller assembly comprises one or more rollers, wherein the one or more rollers are configured to secure the disposable electrode ribbon.

16. The apparatus of claim 15, wherein the one or more rollers are rotatable to advance the disposable electrode ribbon.

17. An apparatus comprising:
 a roller assembly; and
 a disposable electrode ribbon loaded on the roller assembly, wherein the disposable electrode ribbon includes a positive electrode and a negative electrode, wherein the disposable electrode ribbon is configured to electrostatically clean a substrate by electrostatically removing particles from the substrate,
 wherein the roller assembly is configured to advance the disposable electrode ribbon following cleaning of the substrate.

18. A method of cleaning a substrate comprising:
 transferring a substrate from a substrate storage receptable to a substrate stage;
 actuating, with the substrate stage, the substrate to a position under a cleaning head;
 actuating, with a cleaning lift assembly, the substrate to a selected cleaning distance above the substrate;
 activating a disposable electrode ribbon including a positive electrode and a negative electrode to electrostatically clean a surface of the substrate by removing particles from the substrate, wherein the disposable electrode ribbon is activated by applying a bias voltage between the positive electrode and the negative electrode; and
 advancing a roller to expose an unused portion of the disposable electrode ribbon.

19. The method of claim 18, wherein the activating the disposable electrode ribbon to electrostatically clean the surface of the substrate comprises:
 activating the disposable electrode ribbon to electrostatically clean the substrate is performed via dielectrophoresis.

20. The method of claim 18, further comprising:
 determining whether the selected cleaning distance has been attained via a proximity sensor.

\* \* \* \* \*